(12) United States Patent
Mielke et al.

(10) Patent No.: US 6,259,318 B1
(45) Date of Patent: Jul. 10, 2001

(54) METHOD FOR EXTENDING THE LINER RANGE OF AN AMPLIFIER

(75) Inventors: James S. Mielke, Phoenix, AZ (US); Albert H. Higashi, Lawrenceville, GA (US); Serge Drogi, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/322,048

(22) Filed: May 28, 1999

(51) Int. Cl.[7] ................. H03G 3/20; H04B 1/04
(52) U.S. Cl. ............ 330/129; 330/134; 455/127
(58) Field of Search ................. 330/2, 129, 133, 330/134, 279; 455/126, 127

(56) References Cited

U.S. PATENT DOCUMENTS

| | | | |
|---|---|---|---|
| 4,939,786 | * 7/1990 | McCallum et al. | 455/127 |
| 5,055,802 | 10/1991 | Hietala et al. | 331/16 |
| 5,070,310 | 12/1991 | Hietala et al. | 331/1 A |
| 5,278,994 | * 1/1994 | Black et al. | 455/126 |
| 5,278,997 | * 1/1994 | Martin | 455/127 |
| 5,530,922 | * 6/1996 | Nagode | 330/129 |
| 5,589,796 | * 12/1996 | Alberth, Jr. et al. | 330/133 |
| 5,724,004 | * 3/1998 | Reif et al. | 330/296 |
| 6,049,704 | * 4/2000 | Peckham et al. | 330/279 |

* cited by examiner

Primary Examiner—Robert Pascal
Assistant Examiner—Khanh Van Nguyen
(74) Attorney, Agent, or Firm—Lanny L. Parker

(57) ABSTRACT

A transceiver (10) includes a transmitter (16) that receives a digital data stream from a digital signal processor (18) to delay lines (20, 30). The delay lines (20,30) provide an address to a ROM look-up table (40). Another input of the look-up table (40) receives a signal that selects protocols such as TDMA, CDMA, and GSM. A multi-accumulator fractional-N synthesizer (48) receives phase derivative coefficients and a DAC (46) receives amplitude modulation coefficients from the look-up table (40) based on the selected protocol. The analog output signals from the DAC (46) and the synthesizer (48) are received by a variable gain amplifier (54) that generates an RF amplitude and frequency modulated output signal for transmission from the transmitter (16). The look-up table (40) stores phase derivative coefficients and amplitude modulation coefficients that correct for non-linearity in the variable gain amplifier (54).

19 Claims, 2 Drawing Sheets

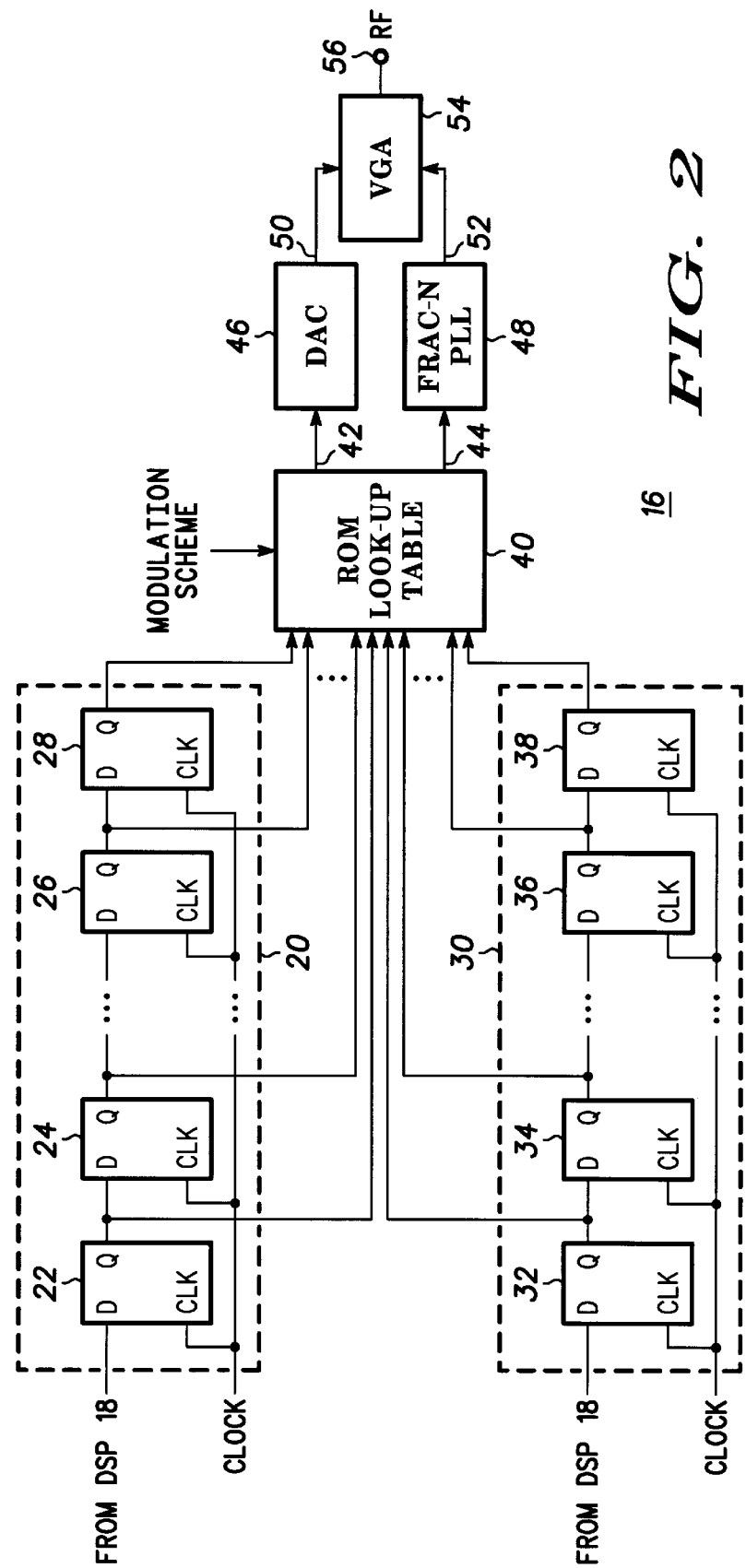

METHOD FOR EXTENDING THE LINER RANGE OF AN AMPLIFIER

BACKGROUND OF THE INVENTION

The present invention relates, in general, to transmitters and, more particularly, to an amplifier for generating an amplitude and frequency modulated signal.

Phase-Locked Loop (PLL) frequency synthesis is a well known technique for generating one of many related signals from a Voltage Controlled Oscillator (VCO). In a PLL, an output signal from the VCO is coupled to a programmable frequency divider which divides by a selected integer number. A phase detector compares the frequency divided signal to a reference signal and any difference in phase between the frequency divided signal and the reference signal is output from the phase detector, coupled through a loop filter, and applied to the VCO. The VCO provides an output signal that changes in frequency such that the phase error between the frequency divided signal and the reference signal is minimized.

In order to overcome the limitations of the output frequency step size being constrained to be equal to the reference signal frequency, a fractional-N synthesizer having programmable frequency dividers capable of dividing by non-integers has been developed. Output frequency step sizes which are fractions of the reference signal frequency are obtained while maintaining a high reference frequency and wide loop bandwidth. A transmitter that includes a fractional-N synthesizer has been used to provide a phase modulation signal for Global System for Mobil communications (GSM). Other communications protocols such as Time Division Multiple Access (TDMA) and Code Division Multiple Access (CDMA) require amplitude modulation in addition to the phase modulation. An in-phase and quadrature (I/Q) modulator is typically used for combining a signal with complex coefficients in generating the amplitude and frequency modulated RF signal that is transmitted by the transmitter. However, RF signals with amplitude modulated components must be amplified by very linear amplifiers which have low efficiency.

Hence, a need exists for a transmitter capable of operating over a wide frequency band, while providing an RF modulated output signal having both amplitude modulation and phase modulation at high efficiency.

BRIEF DESCRIPTION OF THE DRAWING

FIG. 2 is a block diagram of a portion of the transmitter as illustrated in FIG. 1;

DETAILED DESCRIPTION OF THE DRAWINGS

Figure 1:
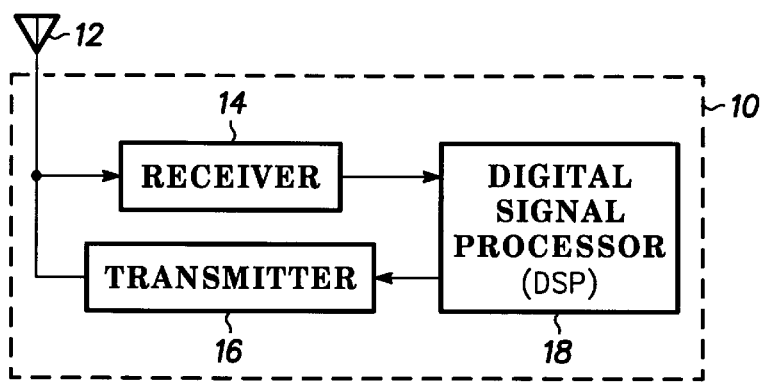
FIG. 1 is a block diagram of a transceiver circuit.

FIG. 1 is a block diagram of a transceiver circuit 10. Transceiver circuits are used in wireless communication applications such as cordless telephones, cellular telephones, and land mobile telephones. The receiver portion 14 of transceiver circuit 10 typically receives a Radio Frequency (RF) modulated signal from an antenna 12. The RF signals received from antenna 12 are typically buffered by an input low-noise amplifier before being sent to a filter and a mixer (not shown). The mixer uses a local oscillator signal for downconverting the RF signal to an Intermediate Frequency (IF) signal that is converted to a digital signal that is transferred to a Digital Signal Processor (DSP) 18 for additional processing. A digital output signal from DSP 18 is transferred to a transmitter 16. The digital output signal is amplitude and frequency modulated and the RF signal is then transmitted from antenna 12.

FIG. 2 is a block diagram of a portion of transmitter 16 as illustrated in FIG. 1. Transmitter 16 receives a first digital data signal from DSP 18 that is time delayed by shifting the data signal through a shift register or delay line 20. Delay line 20 includes D-latches 22, 24, 26, and 28, each having a data input D, a clock input CLK, and an output Q. The D-latches in delay line 20 have commonly connected clock inputs that receive the clock signal CLOCK. The data input of D-latch 22 is connected to the output of DSP 18 for receiving digital data in a serial data stream. The output of D-latch 22 is connected to the data input of D-latch 24. The output of D-latch 24 is coupled through an additional number of D-latches (not shown) to a data input of D-latch 26. The output of D-latch 26 is connected to the data input of D-latch 28.

Transmitter 16 further receives a second digital data signal from DSP 18 that is time delayed by shifting the data signal through a shift register or delay line 30. Delay line 30 includes D-latches 32, 34, 36, and 38, each having a data input D, a clock input CLK, and an output Q. The D-latches in delay line 30 also have commonly connected clock inputs that receive the clock signal CLOCK. The data input of D-latch 32 is connected to the output of DSP 18 for receiving digital data in a serial data stream. The output of D-latch 32 is connected to the data input of D-latch 34. The output of D-latch 34 is coupled through an additional number of D-latches (not shown) to a data input of D-latch 36. The output of D-latch 36 is connected to the data input of D-latch 38.

The outputs of D-latches 22, 24, . . . , 26, and 28, and the outputs of D-latches 32, 34, . . . , 36, and 38 are connected to inputs of a Read Only Memory (ROM) look-up table 40. In the preferred embodiment, look-up table 40 is a Read Only Memory (ROM), but other types of memory such as Random Access Memory (RAM), Programmable Read Only Memory (PROM), data latches in a register array, or the like, could be used for storing the data coefficients. A Digital-to-Analog Converter (DAC) has an input terminal connected to output terminal 42 of ROM look-up table 40. A FRAC-N PLL 48 has an input terminal connected to output terminal 44 of ROM look-up table 40. A Variable Gain Amplifier (VGA) 54 has a first terminal connected to an output terminal 50 of DAC 46 and a second terminal connected to an output terminal 52 of FRAC-N PLL 48. An output signal from VGA 54 is supplied at terminal 56.

Alternatively, the function provided by delay lines 20 and 30 and ROM look-up table 40 could be implemented by a state machine. In yet another embodiment, the hardware of delay lines 20 and 30, and ROM look-up table 40 could be replaced by software processes performed within DSP 18. DSP 18 would receive an input that selects the modulation scheme and use internal memory to provide the amplitude modulation coefficients at terminal 42 and the phase derivative coefficients at terminal 44.

Figure 3:
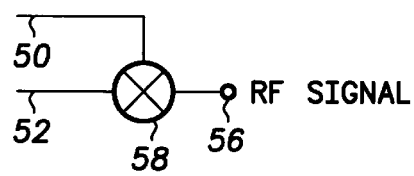
FIG. 3 illustrates one embodiment of a variable gain amplifier as shown in FIG. 2.

FIG. 3 illustrates one embodiment of VGA 54 as shown in FIG. 2. In this embodiment, an RF mixer 58 receives an input analog signal from DAC 46 and another input analog signal from FRAC-N PLL 48. It should be noted that RF mixer 58 can be configured for receiving either single ended or differential signals. The analog signal supplied at terminal 50 by DAC 46 contains amplitude information that is combined within RF mixer 58 with the analog signal supplied at terminal 52 by FRAC-N PLL that contains frequency information. Therefore, the signal generated by RF mixer 58 at terminal 56 has both Amplitude Modulation (AM) and Frequency Modulation (FM). The AM/FM signal is transmitted from antenna 12 (see FIG. 1) by transmitter 16.

Figure 4:
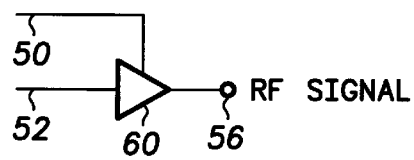
FIG. 4 illustrates another embodiment of the variable gain amplifier.

FIG. 4 illustrates another embodiment of VGA 54 for generating the AM/FM modulated output signal. In this embodiment, a buffer 60 has an input coupled for receiving the analog signal containing frequency information that is supplied at terminal 52 by FRAC-N PLL. The operating voltage of buffer 60 is changed by the analog signal containing the amplitude information that is supplied at terminal 50 by DAC 46. Thus, the signal generated by buffer 60 at terminal 56 has both amplitude and frequency modulation. Although buffer 60 is shown as a non-inverting buffer, it should be noted that buffer 60 can be an inverting buffer.

Figure 5:
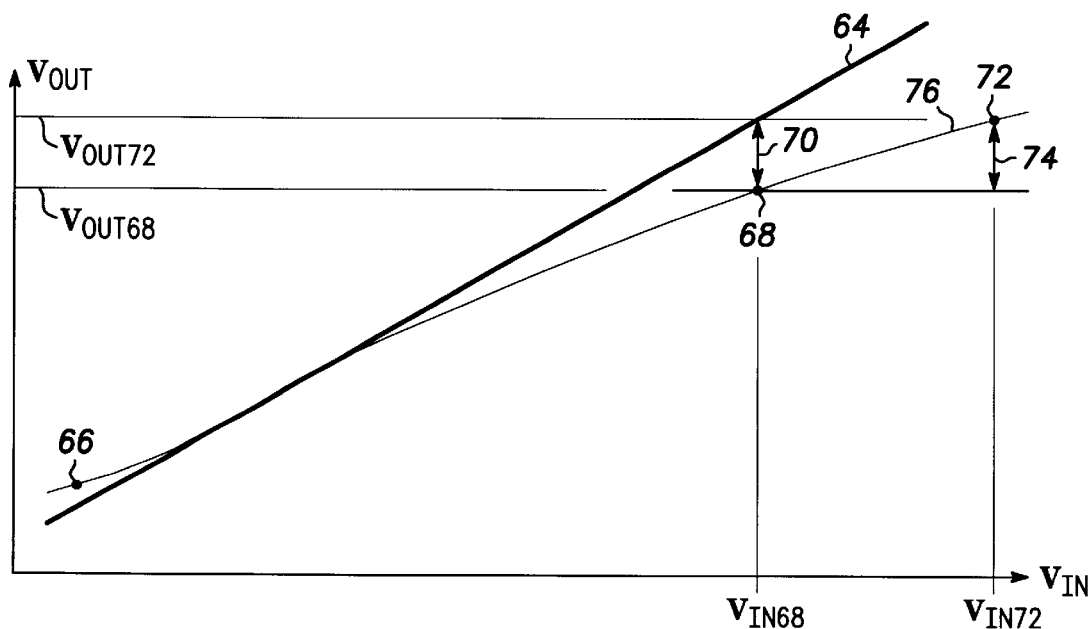
FIG. 5 is a transfer characteristic curve showing nonlinear amplitude amplification for the variable gain amplifier.

FIG. 5 is a transfer characteristic curve that illustrates non-linear amplitude amplification by VGA 54. The horizontal axis represents the voltage ($V_{IN}$) of the input signal of VGA 54 and the vertical axis represents the voltage ($V_{OUT}$) of the output signal. Line 64 represents the ideal transfer characteristic curve for amplitude amplification by a variable gain amplifier, i.e., a straight line relationship for a constant gain. Thus, the ideal variable gain amplifier exhibits a linear transfer characteristic where the ratio of the output voltage to the input voltage is constant over the entire operating range of the amplifier.

However, VGA 54 does not provide linear amplitude amplification over its entire operating range, as illustrated by transfer characteristic curve 76. When VGA 54 receives input voltage values $V_{IN}$ that correspond to points 66, 68, or 72 on transfer characteristic curve 76, then VGA 54 is said to be operating in the non-linear portion of its operating range. While operating in the non-linear range, VGA 54 generates output voltage values $V_{OUT}$ that deviate from the voltage values that the linear amplifier would generate. It should be noted that VGA 54 can have transfer characteristics other than the transfer characteristics illustrated by curve 76, but correction of the non-linearity remains within the scope of the present invention.

Difference value 70 represents the difference in the output voltage $V_{OUT72}$ that is generated by an ideal linear amplifier and the output voltage $V_{OUT68}$ that is generated by VGA 54 for an input voltage $V_{IN68}$. The difference value 70 is a measure of the non-linearity of VGA 54 when operating at an input voltage $V_{IN68}$. By increasing the input voltage of VGA 54 to a value VIN72, the difference value 74 substantially matches the difference value 70. Thus, by substituting an input voltage of $V_{IN72}$ in place of the input voltage $V_{IN68}$, VGA 54 provides an output voltage $V_{OUT72}$, keeping VGA 54 in the linear range of operation.

In operation, referring to FIG. 1, the present invention is suitable for improving the linear operation of wireless communication applications using protocols that operate at different frequencies. By way of example, receiver 14 and transmitter 16 respectively receive and transmit signals having frequencies of about 900 MegaHertz (MHz) for cordless telephones, or frequencies ranging from about 900 MHz to 1800 MHz for cellular telephones, or frequencies of about 150 MHz, 300 MHz, 450 MHz, etc., for land mobile telephones, or frequencies of about 2.4 GigaHertz (GHz) for wire data such as email.

Referring to FIGS. 1 and 2, a serial data stream that is to be transmitted is transferred from DSP 18 to transmitter 16 and shifted through delay lines 20 and 30 by the signal CLOCK. The data stored in the latches of delay lines 20 and 30 provides the address values for ROM look-up table 40. In addition to the address values, ROM look-up table 40 further receives a signal at the MODULATION SCHEME terminal that selects a user defined protocol such as Time Division Multiple Access (TDMA), Code Division Multiple Access (CDMA), and Global System for Mobil communications (GSM). In accordance with the present invention, ROM look-up table 40 stores phase derivative coefficients and amplitude modulation coefficients for the user selected protocols. It should be noted that only the phase derivative coefficients are supplied by ROM look-up table 40 when the GSM protocol is selected.

For a selected protocol, ROM look-up table 40 supplies multiple phase derivative coefficients to FRAC-N PLL 48 at terminal 44 and multiple amplitude modulation coefficients at terminal 42 to DAC 46 for each address provided by delay lines 20 and 30. Thus, multiple sets of phase and amplitude coefficients are generated by ROM look-up table 40 for each address supplied from delay lines 20 and 30. ROM look-up table 40 provides phase derivative coefficients and amplitude modulation coefficients based on the current address and a prior history of the data as provided by the previous address. In other words, a first set of phase and amplitude coefficients are generated by ROM look-up table 40, followed by a second set of phase and amplitude coefficients, etc., with each set of coefficients having values that are based on the current address in relation to the previous address. The number of sets of coefficients generated between changes in address, as caused by the signal CLOCK to delay lines 20 and 30, is dependent upon the selected protocol.

To achieve rapid frequency changes, modulation, and low spurious signal and noise levels, a fractional-N synthesizer is employed in the present invention. FRAC-N PLL 48 is a fractional-N frequency synthesizer that uses multiple accumulators and programmable frequency dividers (not shown) for division by a non-integer. For modulation, FRAC-N PLL 48 employs ROM look-up table 40 to convert the data stream that is to be transmitted, as supplied from DSP 18, into frequency offsets for the fractional-N synthesizer. The loop division of the synthesizer is adjusted in accordance with the phase derivative coefficients received at terminal 44 that follow the instantaneous frequency offset required for the phase modulated signal. The overall effect of FRAC-N PLL 48 is to integrate the differential phase and to provide a constant envelope RF phase-modulated signal. The phase-modulated signal, with modulation based on the selected protocol, is provided at the output of FRAC-N PLL 48.

In addition, the amplitude modulation coefficients supplied from ROM look-up table 40 are transferred to DAC 46 for conversion to an analog signal that is representative of the amplitude modulation coefficient. In one embodiment, the analog signal generated by DAC 46 containing amplitude information is transferred to RF mixer 58 (see FIG. 3) along with another analog signal from FRAC-N PLL 48 containing phase information. RF mixer 58 mixes the two analog signals and generates a signal at terminal 56 having both amplitude and frequency modulation.

In a second embodiment, the analog signal generated by FRAC-N PLL 48 contains phase information that is transferred to the gate terminal of buffer 60 (see FIG. 4). The analog signal generated by DAC 46 contains amplitude information that is transferred to the operating power supply of buffer 60. Buffer 60 combines the two analog signals and generates a signal at terminal 56 having both amplitude and frequency modulation. For either embodiment, the AM/FM modulated signal is transmitted from antenna 12 (see FIG. 1) by transmitter 16.

VGA 54 is characterized over its operating range, having a linear region and a non-linear region. In the linear region, an input voltage of VGA 54 is amplified by a first amplification factor that remains substantially constant over the entire linear region. However, when operating VGA 54 in the non-linear region, input voltages of VGA 54 are amplified by amplification factors that differ from the first amplification factor. In order to extend the linear region of VGA 54, corrected coefficients are stored in ROM look-up table 40 that correct for the non-linearity of VGA 54 and cause an extension to the amplifier's linear operating region.

The corrected coefficients received by DAC 46 are converted to corrected analog voltages at the input of VGA 54. A corrected voltage at the input of VGA 54 is amplified by an amplification factor in generating an output voltage that would be substantially equivalent to a product of the uncorrected input voltage and the first amplification factor. Thus, based on characterization data of VGA 54, corrected coefficients stored in ROM look-up table 40 cause corrected input voltages at the input of VGA 54 that improve and extend the linear operating region of VGA 54.

One feature of the present invention is that VGA 54 operates linearly over its operating range when generating a phase and frequency modulated output signal at terminal 56. Referring to FIGS. 2 and 5, after a particular VGA 54 is selected for use in transmitter 16, that VGA 54 is characterized and the linear operating regions and the non-linear operating regions are defined. Based on the characterization for the selected VGA 54, ROM look-up table 40 stores amplitude modulation coefficients that DAC 46 converts to corrected input voltages at the input of VGA 54. The corrected input voltages account for VGA 54 operating in a non-linear region with a gain that differs from the gain of the amplifier when operated in the linear region. Thus, by storing corrected coefficients in ROM look-up table 40, DAC 46 supplies corrected input voltages to VGA 54 that account for the non-linear amplitude regions of VGA 54. The linear operating region of VGA 54 is extended.

Although FIG. 5 illustrates amplitude non-linearity, VGA 54 can also generate an output signal having a non-linear phase relationship to the input signal. In this case, ROM look-up table 40 stores corrected phase derivative coefficients that FRAC-N PLL 48 converts to correct for phase shifts caused within VGA 54.

By way of example, data from DSP 18 provides an address to ROM look-up table 40 that stores phase derivative coefficients and amplitude modulation coefficients. ROM look-up table 40 supplies the coefficient values based on the address supplied from delay lines 20 and 30 and the selected modulation scheme. When ROM look-up table 40 stores coefficient values that have not been corrected, a voltage $V_{IN68}$ supplied at terminal 50 by DAC 46 generates an output voltage $V_{OUT68}$ (see FIG. 5) at the output of VGA 54. The voltage $V_{OUT68}$ is based on transfer curve 76 that is not linear. Thus, the non-linearity of the selected VGA 54 is not corrected and the voltage $V_{OUT68}$ deviates from the desired voltage $V_{OUT72}$.

However, when ROM look-up table 40 stores the coefficient values that correct for the non-linearity of VGA 54, the corrected amplitude coefficients cause DAC 46 to generate the voltage $V_{IN72}$, instead of the voltage $V_{IN68}$. The voltage $V_{IN72}$ received at the input of VGA 54 generates the output voltage $V_{OUT72}$. Note that the voltage $V_{OUT72}$ is a value on the linear transfer characteristic curve 64. Thus, the undesired amplitude non-linearity of the selected VGA 54 is corrected by storing the appropriate corrected amplitude coefficients in ROM look-up table 40. Different correction coefficients are stored in ROM look-up table 40 for correcting for the non-linearity of different types of VGA 54. In addition, the undesired phase non-linearity of the selected VGA 54 is corrected by storing the appropriate corrected phase derivative coefficients in ROM lookup table 40. FRAC-N PLL 48 converts the corrected phase derivative coefficients to an analog signal having the proper phase at the input of VGA 54 that corrects for the phase non-linearity caused by VGA 54.

By now it should be appreciated that a transmitter using a fractional-N synthesizer and a look-up table to provide both amplitude and phase derivative coefficients has been provided. The amplitude coefficients are converted by a DAC from a digital signal to an analog signal. A variable gain amplifier combines the amplitude modulated signal from the DAC with the frequency modulated signal from the fractional-N synthesizer. The amplitude and phase non-linearity caused by the variable gain amplifier is corrected by modifying the amplitude and phase derivative coefficients stored in the look-up table. The transmitter accommodates various communications protocols over a wide band of frequency operation and transmits an RF output signal having both amplitude and frequency modulation.

What is claimed is:

1. A method of improving the linear operation of an amplifier, comprising the steps of:

characterizing the amplifier for operation in a linear region where a first input voltage is amplified by a first amplification factor and generates a first output voltage; and characterizing the amplifier for operation in a non-linear region where a corrected input voltage is substituted for a second input voltage and amplified by a second amplification factor to generate a second output voltage that is substantially equivalent to a product of the second input voltage and the first amplification factor.

2. The method of claim 1, further including the step of characterizing the amplifier for phase non-linearity where a corrected phase input signal is substituted for an input signal and corrects for the phase non-linearity of the amplifier.

3. The method of claim 2, further including the step of receiving the corrected input signal from a fractional-N synthesizer.

4. The method of claim 3, further including the step of addressing a memory to retrieve a phase derivative coefficient that is converted by the fractional-N synthesizer to the corrected input signal that is used to correct the phase non-linearity of the amplifier.

5. The method of claim 1, further including the step of receiving the first input voltage and the corrected input voltage from a digital-to-analog converter (DAC).

6. The method of claim 5, further including the step of addressing a memory to retrieve a first coefficient that is translated to the first input voltage by the DAC.

7. The method of claim 6, wherein the step of addressing the memory to retrieve the first coefficient further includes the step of supplying the first coefficient from the memory based on selecting a modulation scheme.

8. The method of claim 7, further including the step of addressing a memory to retrieve a second coefficient that is converted by the DAC to a corrected input voltage, where the second coefficient is determined based on the step of characterizing the amplifier in the non-linear region of operation.

9. A method of providing linear amplification when an amplifier has a first amplification factor when operating in a linear region and a second amplification factor when operating in a non-linear region, comprising the steps of:

amplifying a first input voltage by the first amplification factor in generating a first output voltage when operating the amplifier in the linear region;

substituting a corrected input voltage for a second input voltage when operating the amplifier in the non-linear region; and amplifying the corrected input voltage by the second amplification factor in generating a second output voltage that is substantially equivalent to a product of the second input voltage and the first amplification factor to provide linear amplification of the amplifier.

10. The method of claim 9, further including the step of generating an amplitude characteristic transfer curve for the amplifier in determining the value for the corrected input voltage.

11. The method of claim 9, further including the step of storing a coefficient in a memory for conversion to the corrected input voltage.

12. The method of claim 11, further including the step of supplying the coefficient from the memory based on selecting a modulation scheme.

13. The method of claim 12, further including the step of selecting the modulation scheme from a group consisting of Time Division Multiple Access (TDMA), Code Division Multiple Access (CDMA), and Global System for Mobil communications (GSM).

14. The method of claim 11, further including the step of using a digital-to-analog converter (DAC) for converting the coefficient to the corrected input voltage.

15. The method of claim 9, further including the step of characterizing the amplifier for phase non-linearity to provide an input signal to the amplifier having a corrected phase that corrects for the phase non-linearity of the amplifier.

16. The method of claim 15, further including the step of storing a coefficient in a memory for conversion to the input signal having the corrected phase.

17. A method of extending a linear range of an amplifier, comprising the steps of:

storing coefficients in a memory;

converting the coefficients to input voltages;

supplying the input voltages to the amplifier when the amplifier operates in a linear portion of an operating range for providing corresponding output voltages that are a first amplification factor times the input voltages;

storing a corrected coefficient in place of an uncorrected coefficient in the memory when operating the amplifier in a nonlinear region of operation; and converting the corrected coefficient to an input voltage of the amplifier that is amplified by a second amplification factor in generating an output voltage that is substantially linear with the output voltages.

18. The method of claim 17, wherein the step of converting the coefficients to input voltages further includes the step of using a Digital-to-Analog Converter (DAC).

19. The method of claim 17, wherein the step of storing coefficients in a memory further includes the step of storing coefficients for Time Division Multiple Access (TDMA), Code Division Multiple Access (CDMA), and Global System for Mobil communications (GSM).

* * * * *